United States Patent
Park

(10) Patent No.: US 10,955,758 B2
(45) Date of Patent: Mar. 23, 2021

(54) GUIDE PIN, PHOTO MASK SUPPORTING UNIT INCLUDING THE SAME, AND PHOTO MASK CLEANING APPARATUS INCLUDING THE SAME

(71) Applicant: SEMES CO., LTD., Chungcheongnam-do (KR)

(72) Inventor: Shi Hyun Park, Chungcheongnam-do (KR)

(73) Assignee: SEMES Co., Ltd., Chungcheongnam-do (KR)

(*) Notice: Subject to any disclaimer, the term of this patent is extended or adjusted under 35 U.S.C. 154(b) by 0 days.

(21) Appl. No.: 16/658,215

(22) Filed: Oct. 21, 2019

(65) Prior Publication Data
US 2020/0124987 A1 Apr. 23, 2020

(30) Foreign Application Priority Data
Oct. 22, 2018 (KR) .................. 10-2018-0125846

(51) Int. Cl.
*G03F 7/20* (2006.01)

(52) U.S. Cl.
CPC ...... *G03F 7/70716* (2013.01); *G03F 7/70925* (2013.01)

(58) Field of Classification Search
CPC ........... G03F 7/70716; H01L 21/67051; H01L 21/68728; H01L 21/02057
USPC .................................................. 355/72–76
See application file for complete search history.

(56) References Cited

U.S. PATENT DOCUMENTS

| | | | |
|---|---|---|---|
| 9,359,672 B2 | 6/2016 | Verghese et al. | |
| 10,453,674 B2 | 10/2019 | Nakamura | |
| 2006/0156981 A1* | 7/2006 | Fondurulia | C23C 16/45591 118/715 |
| 2008/0102001 A1* | 5/2008 | Chandrachood | H01J 37/32715 422/129 |

(Continued)

FOREIGN PATENT DOCUMENTS

| | | |
|---|---|---|
| JP | 09173944 A | 7/1997 |
| JP | 2007059664 A | 3/2007 |

(Continued)

OTHER PUBLICATIONS

Korean Office Action for Korean Application No. 10-2018-0125846, dated Apr. 8, 2020, 6 pages.

(Continued)

*Primary Examiner* — Hung Nguyen
(74) *Attorney, Agent, or Firm* — RatnerPrestia

(57) ABSTRACT

Provided are a guide pin configured to support a corner of a photo mask using a double slide structure, a photo mask supporting unit including the same, and a photo mask cleaning apparatus including the same. The photo mask supporting unit includes a supporting plate, a supporting shaft which supports the supporting plate from under the supporting plate, a supporting plate driver configured to rotate the supporting plate, and a guide pin provided as a plurality of guide pins on the supporting plate to support a photo mask and including at least one column protruding upward from a flat surface and having a first sliding portion and a second sliding portion formed on a side surface of the column to be inclined downward to have different angles.

8 Claims, 10 Drawing Sheets

(56) References Cited

U.S. PATENT DOCUMENTS

| | | | |
|---|---|---|---|
| 2015/0243542 A1* | 8/2015 | Yoshihara | H01L 21/02057 156/345.15 |
| 2017/0110355 A1 | 4/2017 | Numanami et al. | |
| 2018/0005849 A1 | 1/2018 | Lee et al. | |
| 2019/0113839 A1* | 4/2019 | Lee | G03F 7/70925 |
| 2019/0214290 A1* | 7/2019 | Marcelynas | H01L 21/68742 |

FOREIGN PATENT DOCUMENTS

| | | |
|---|---|---|
| KR | 20070091332 A | 9/2007 |
| KR | 20080071685 A | 8/2008 |
| KR | 20080083424 A | 9/2008 |
| KR | 20130028181 A | 3/2013 |
| KR | 101266789 B1 | 5/2013 |
| KR | 20170046083 A | 4/2017 |
| KR | 20180003678 A | 1/2018 |
| KR | 20180021153 A | 2/2018 |

OTHER PUBLICATIONS

Korean Grant of Patent for Korean Application No. 10-2018-0125846, dated Sep. 1, 2020, with translation, 3 pages.

\* cited by examiner

[FIG. 1]
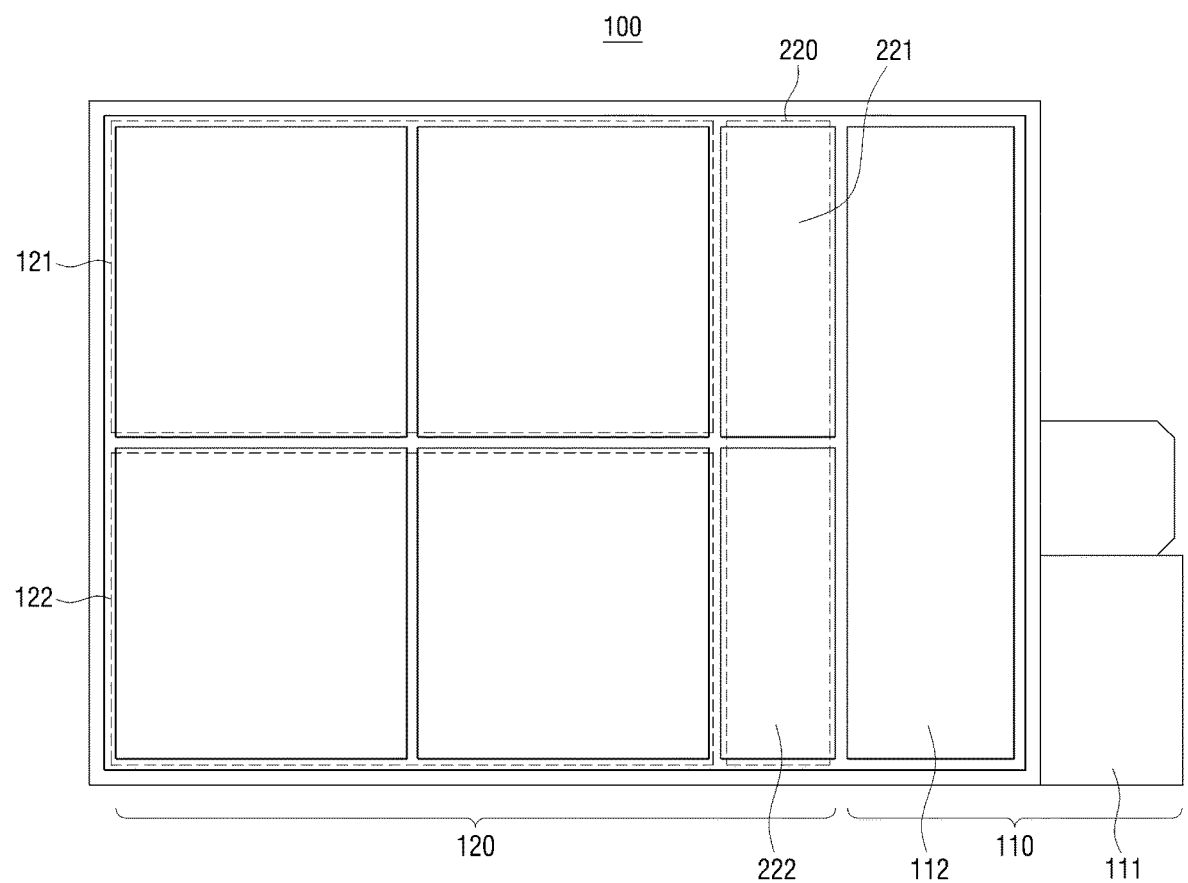

[FIG. 2]
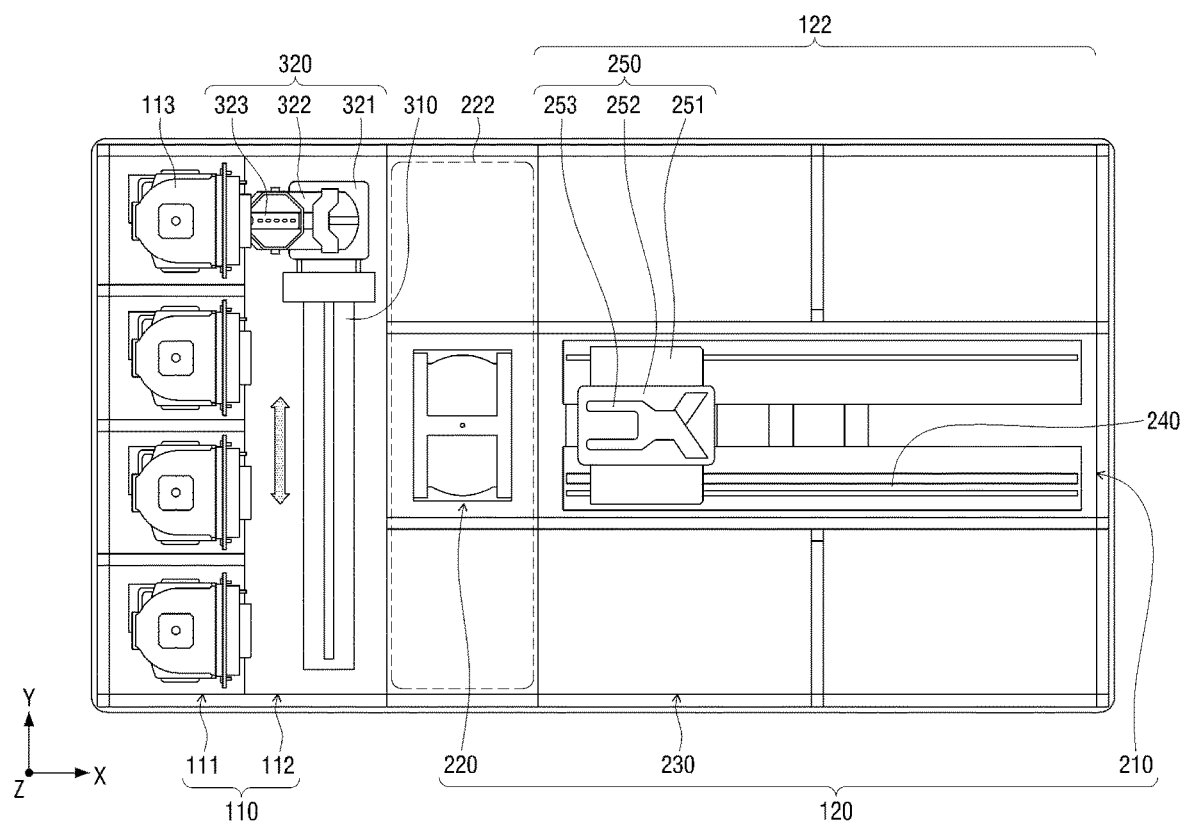

[FIG. 3]
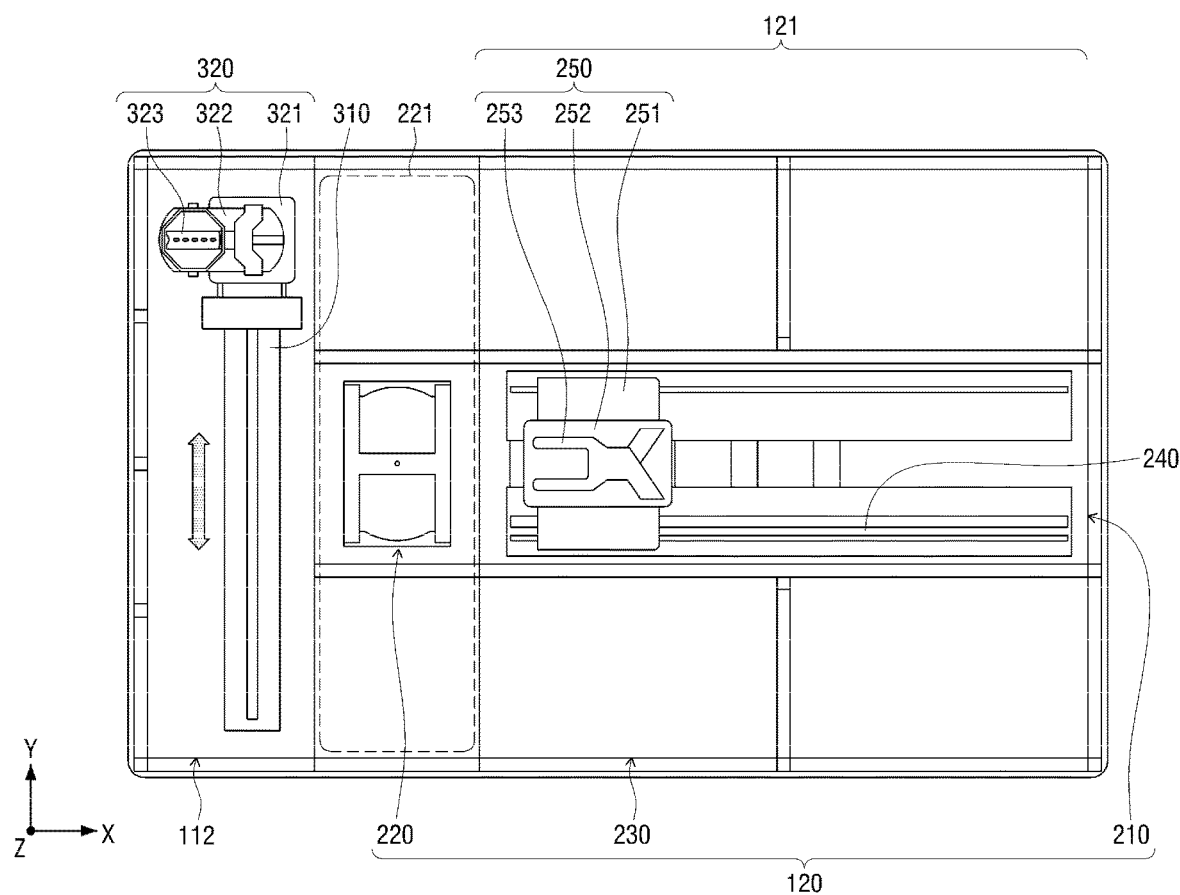

[FIG. 4]
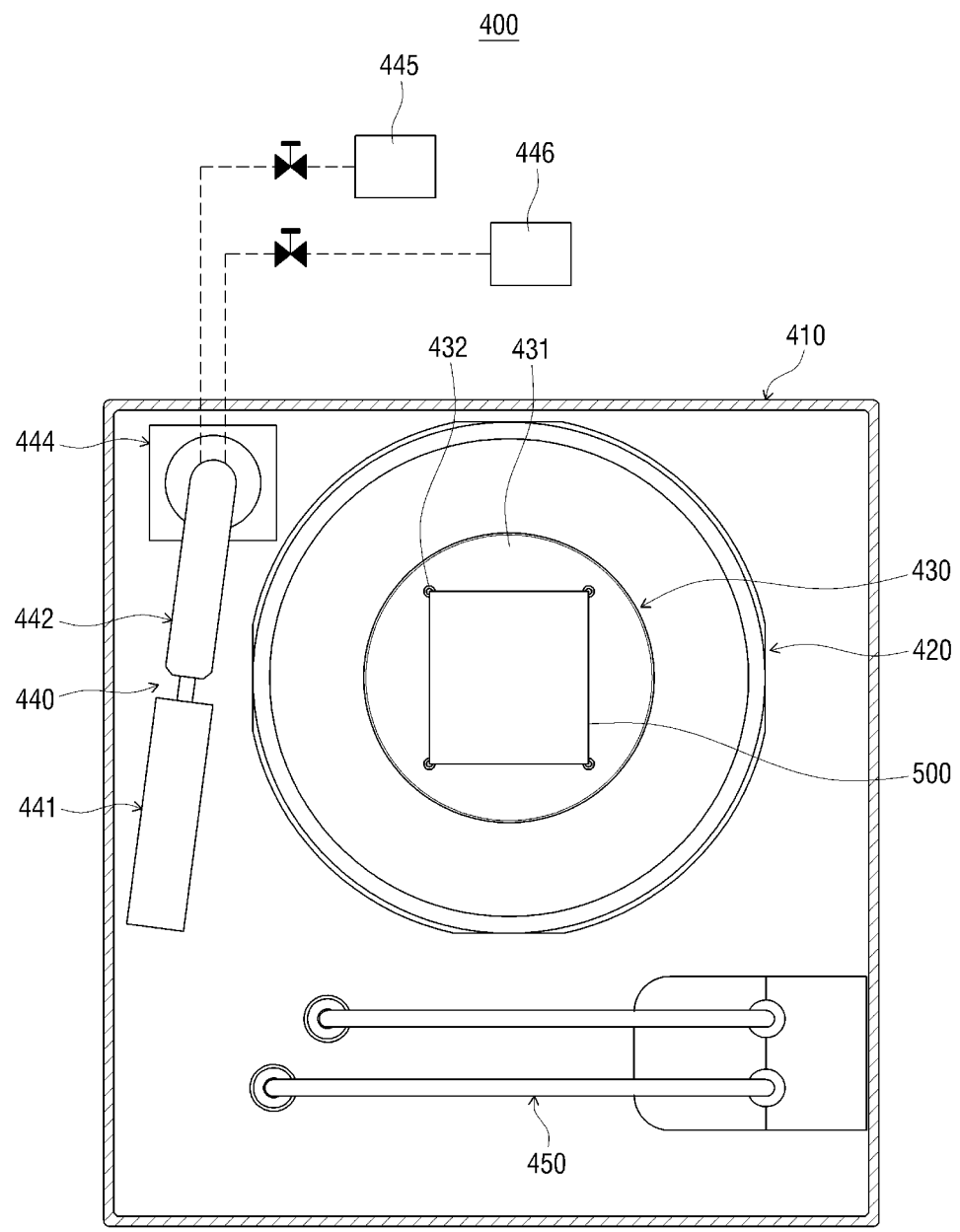

[FIG. 5]
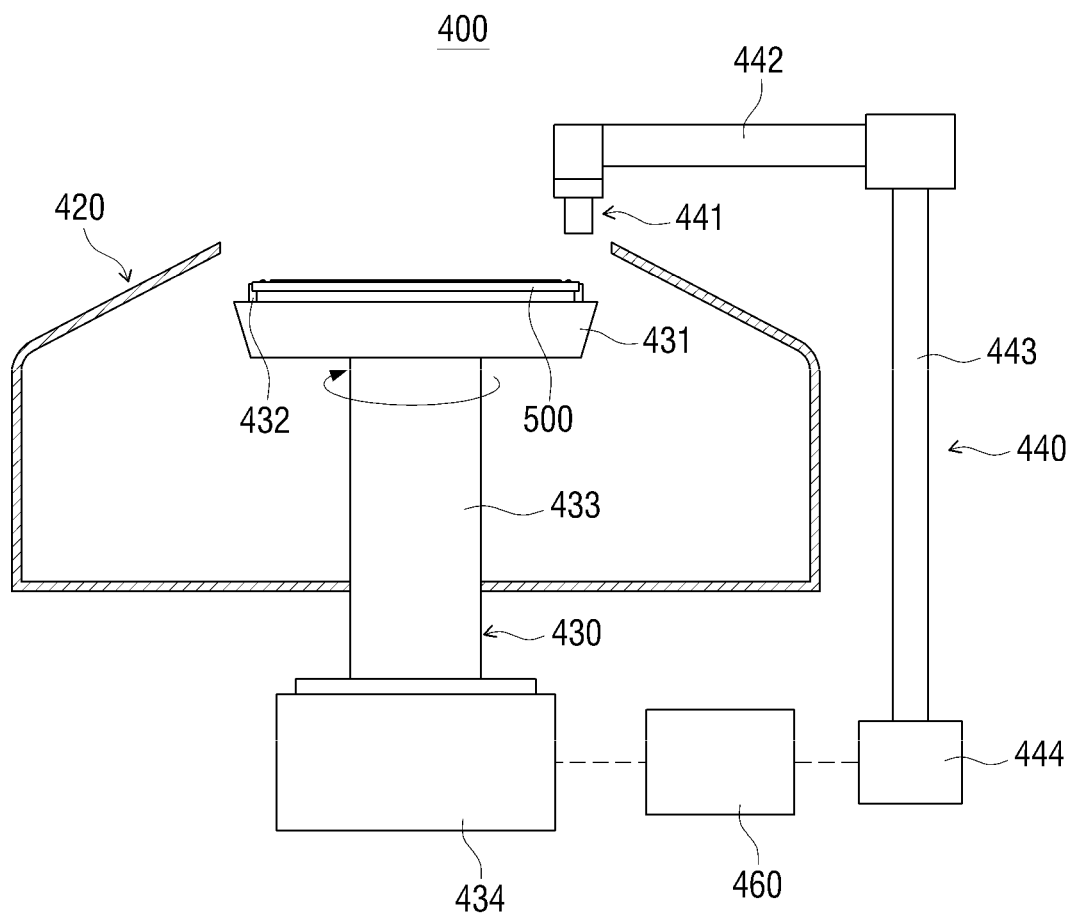

[FIG. 6]
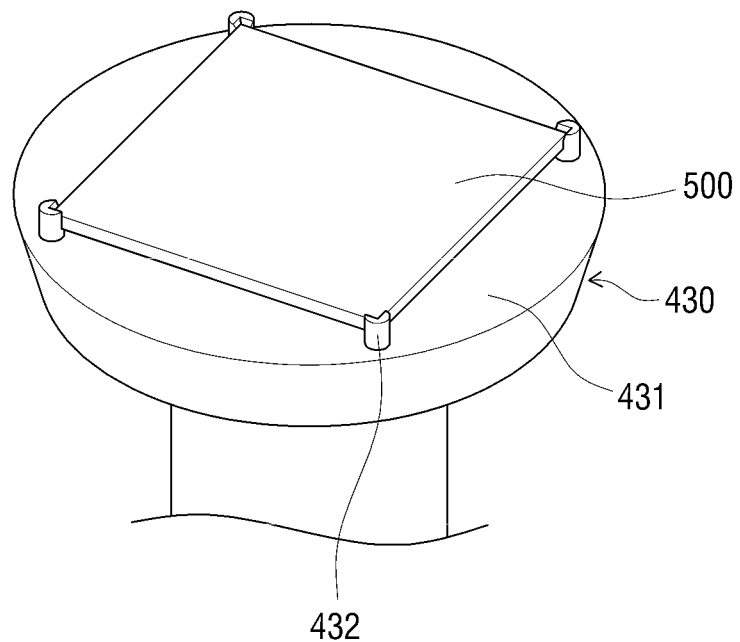

[FIG. 7]
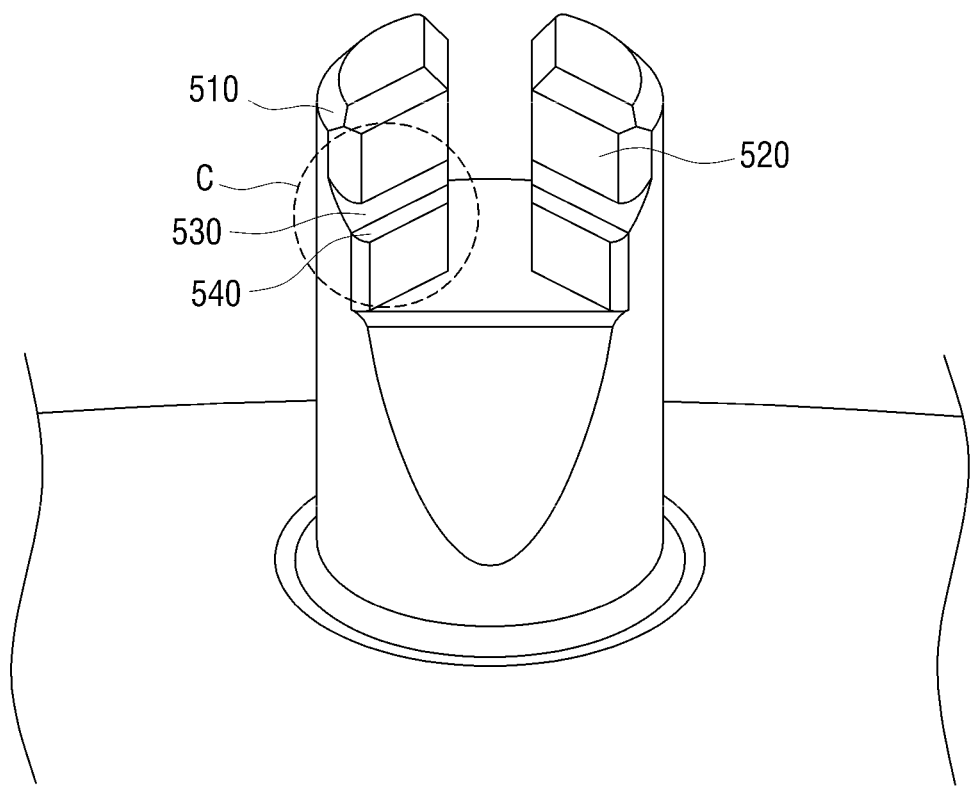

[FIG. 8]
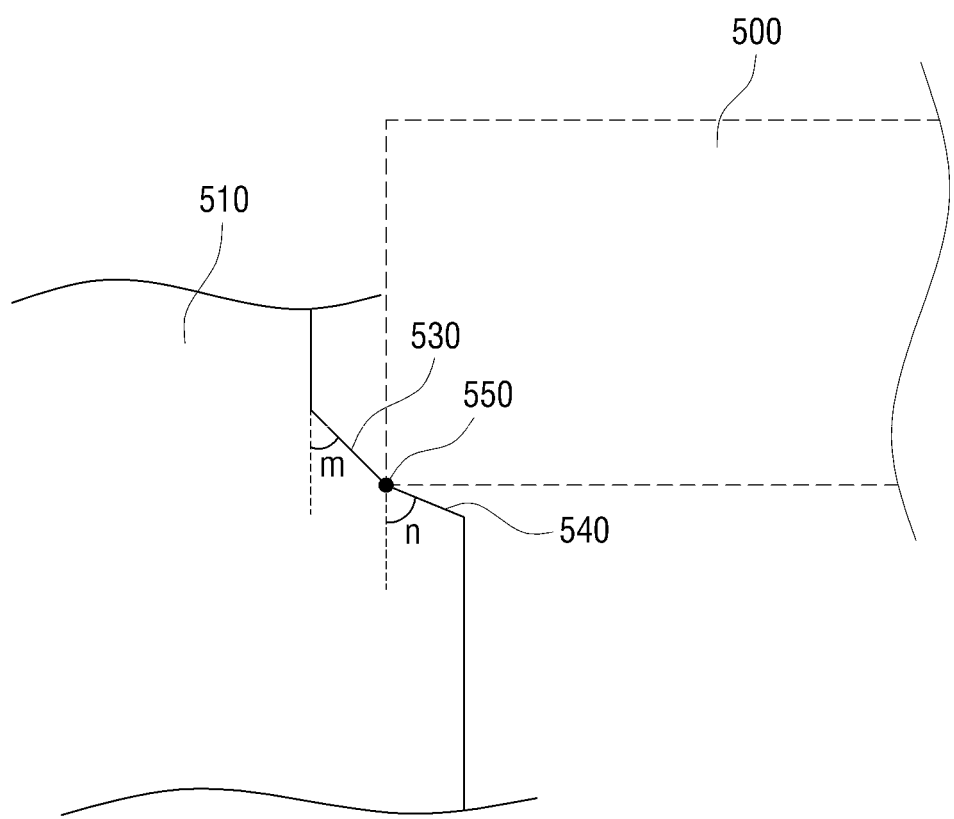

[FIG. 9]
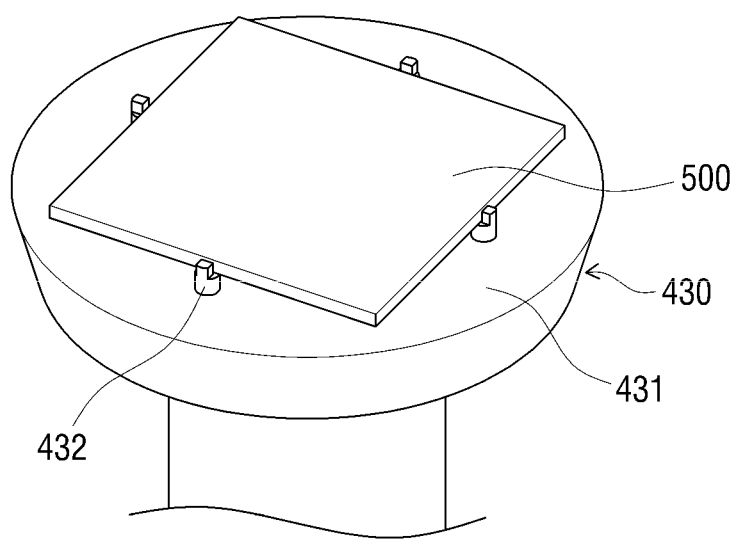

[FIG. 10]
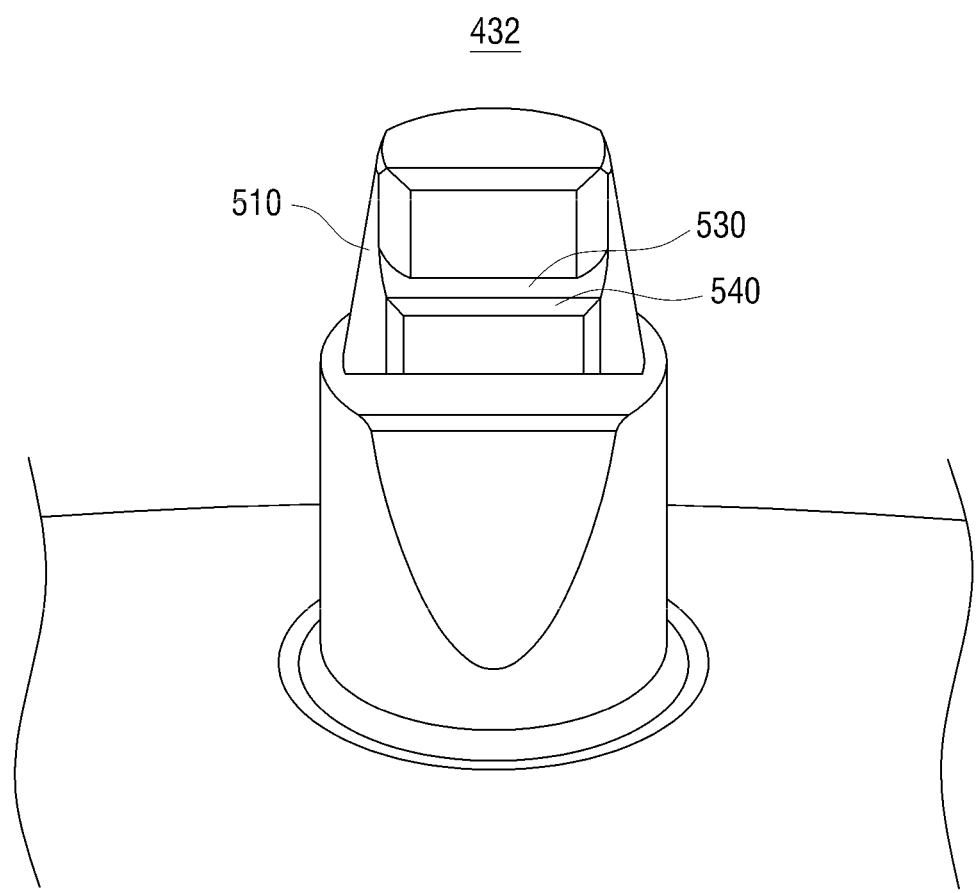

GUIDE PIN, PHOTO MASK SUPPORTING UNIT INCLUDING THE SAME, AND PHOTO MASK CLEANING APPARATUS INCLUDING THE SAME

CROSS-REFERENCE TO RELATED APPLICATION

This application claims priority from Korean Patent Application No. 10-2018-0125846, filed on Oct. 22, 2018, in the Korean Intellectual Property Office, the disclosure of which is incorporated herein by reference in its entirety.

BACKGROUND

1. Field of the Disclosure

The present disclosure relates to a guide pin formed on a photo mask supporting unit to support a photo mask, a photo mask supporting unit including the same, and a photo mask cleaning apparatus including the same.

2. Description of the Related Art

A photo mask is a mask in which a micro circuit of a semiconductor element is formed on a quartz or glass wafer. A micro pattern of the photo mask is transferred onto a photo-resist layer through a photo-lithography process so that a circuit is formed on a wafer.

In a case in which a foreign material remains on a photo mask, when the photo mask is reused in a photo-lithography process, light energy may be applied to the foreign material, and thus the foreign material may act as a haze defect. Since an unwanted pattern is transferred due to the haze defect, the foreign material needs to be removed from the photo mask through a cleaning process.

RELATED ART DOCUMENT

Patent Document

Korea Patent Publication No. 10-2013-0028181 (Publication Date: Mar. 19, 2013.)

SUMMARY

When a foreign material is removed from a photo mask through a cleaning process, the photo mask is seated on a plurality of supporting pins formed on a stage and is rotated on the plurality of supporting pins. At this moment, since the photo mask and the supporting pins are in surface-to-surface contact with each other, scratches may occur on one surface of the photo mask due to the supporting pins.

The present disclosure is directed to providing a guide pin configured to support a corner of a photo mask using a double slide structure, a photo mask supporting unit including the same, and a photo mask cleaning apparatus including the same.

Objectives of the present disclosure are not limited to the above-described objectives, and other objectives which are not described above will be clearly understood by those skilled in the art from the following description.

According to an aspect of the present disclosure, there is provided a photo mask supporting unit including a supporting plate formed to have a diameter greater than a photo mask, a supporting shaft which supports the supporting plate from under the supporting plate, a supporting plate driver configured to rotate the supporting plate, and a guide pin provided as a plurality of guide pins on the supporting plate to support a photo mask and including at least one column protruding upward from a flat surface and having a first sliding portion and a second sliding portion formed on a side surface of the column to be inclined downward to have different angles.

The first sliding portion may be formed to be inclined downward to have a first inclination angle with respect to the side surface of the column, the second sliding portion may be formed to be inclined downward to have a second inclination angle with respect to the side surface of the column, and the second inclination angle may be greater than the first inclination angle.

The first sliding portion and the second sliding portion may be continuously formed on the side surface of the column, and the first sliding portion may be positioned at a higher level than the second sliding portion.

The column may be provided as one column formed to protrude from a flat surface of the guide pin or may be provided as two columns formed to protrude from the flat surface of the guide pin.

In a case in which the column is provided as the two columns formed to protrude from the flat surface of the guide pin, a side surface of a first column in which the first sliding portion and the second sliding portion are formed may not be parallel to a side surface of a second column in which the first sliding portion and the second sliding portion are formed.

The first column and the second column may support corners of the photo mask.

In a case in which the column is provided as the one column formed to protrude from the flat surface of the guide pin, the column may support a flat side surface of the photo mask.

A length of the first sliding portion may be longer than a length of the second sliding portion.

According to another aspect of the present disclosure, there is provided a guide pin provided as a plurality of guide pins on a photo mask supporting unit configured to support a photo mask when the photo mask is cleaned, the guide pin including at least one column having a first sliding portion and a second sliding portion which protrude upward from a flat surface and are formed on side surface of the column to be inclined downward to have different angles.

According to still another aspect of the present disclosure, there is provided a photo mask cleaning apparatus including a housing, a container disposed in the housing and provided with a space in which a photo mask is cleaned, a photo mask supporting unit which is disposed in the container and supports the photo mask, a glue cleaning unit which is disposed at a first side of the container and supplies a chemical to the photo mask to remove glue from the photo mask, and a pattern cleaning unit which is disposed at a second side of the container and supplies a cleaning liquid to the photo mask to clean a pattern, wherein the photo mask supporting unit includes a supporting plate formed to have a diameter greater than the photo mask, a supporting shaft which supports the supporting plate from under the supporting plate, a supporting plate driver configured to rotate the supporting plate, and a guide pin provided as a plurality of guide pins on the supporting plate to support the photo mask and including at least one column protruding upward from a flat surface and having a first sliding portion and a second sliding portion formed on a side surface of the column to be inclined downward to have different angles.

Other specific contents according to the embodiments are included in the detailed descriptions and the accompanying drawings.

BRIEF DESCRIPTION OF THE DRAWINGS

The above and other aspects and features of the present disclosure will become more apparent by describing exemplary embodiments thereof in detail with reference to the attached drawings, in which:

FIG. 1 is a schematic front view illustrating a photo mask cleaning system according to one embodiment of the present disclosure;

FIG. 2 is a plan view illustrating components provided in a lower portion of the photo mask cleaning system;

FIG. 3 is a plan view illustrating components provided in an upper portion of the photo mask cleaning system;

FIG. 4 is a plan view illustrating a photo mask cleaning apparatus provided in a process housing;

FIG. 5 is a side view illustrating the photo mask cleaning apparatus provided in the process housing;

FIG. 6 is a perspective view illustrating a photo mask supporting unit provided in a photo mask cleaning apparatus according to one embodiment;

FIG. 7 is a perspective view illustrating a guide pin provided in a photo mask supporting unit according to one embodiment;

FIG. 8 is a partially enlarged view illustrating the guide pin illustrated in FIG. 7;

FIG. 9 is a perspective view illustrating a photo mask supporting unit provided in a photo mask cleaning apparatus according to another embodiment; and FIG. 10 is a perspective view illustrating a guide pin provided in the photo mask supporting unit according to another embodiment.

DETAILED DESCRIPTION OF THE EMBODIMENTS

Hereinafter, exemplary embodiments of the present disclosure will be described in detail with reference to the accompanying drawings. Advantages and features of the present disclosure and methods of achieving the same will be clearly understood with reference to the following embodiments which will be described in detail and the accompanying drawings. However, the present disclosure is not limited to the embodiments to be disclosed below and may be implemented in different various forms. The embodiments are provided in order to fully explain the present disclosure and fully explain the scope of the present disclosure to those skilled in the art. The scope of the present disclosure is only defined by the appended claims. Like reference numerals refer to like elements throughout the specification.

A case in which an element or layer is referred to as being "on" another element or layer includes a case in which the element is directly present on another element or layer and also includes a case in which the element is present on another element or layer with still another element or layer interposed therebetween. However, a case in which an element is referred to as being "directly on" another element includes a case in which still another element or layer is not interposed therebetween.

Spatially relative terms such as "below," "beneath," "lower," "above," "upper," and the like may be used to more easily describe a relationship between one element or components and another element or other components as illustrated in the drawings. The spatially relative terms should be understood to have directions as illustrated in the drawings and have other directions when the elements are used or operated. For example, when an element illustrated in the drawing is turned upside down, the element which is illustrated to be present below or beneath another element may be present above another element. Accordingly, the example term "below" includes both a downward direction and an upward direction. An element may be arranged in another direction, and thus, the spatially relative terms may be interpreted based on an arrangement direction.

Although first, second, and the like are used to describe various elements, components, and/or sections, the various elements, components, and/or sections are not limited thereto. The terms are only to distinguish one element or component, or sections from another element or component, or sections. Therefore, a first element, a first component, or a first section may also be a second element, a second component, or a second section in the technical spirit of the present disclosure.

The terms used herein are provided only to describe the embodiments of the present disclosure and not to limit the present disclosure. Unless the context clearly indicates otherwise in the specification, the singular forms include the plural forms. It will be understood that the terms "comprise" and/or "comprising" used in the specification do not preclude the presence or addition of one or more other components, steps, operations, and/or elements to a component, a step, an operation, and/or an element.

Unless otherwise defined, all terms (including technical and scientific terms) used in the specification can be used as is customarily understood to those skilled in the art to which this disclosure belongs. Also, it will be further understood that terms, such as those defined in generally used dictionaries, will not be interpreted in idealized or overly formal senses unless clearly and expressly defined herein.

Hereinafter, example embodiments of the disclosure will be described in detail with reference to the accompanying drawings. When the embodiments are described with reference to the accompanying drawings, components that are the same or correspond to each other are denoted by the same reference numerals regardless of the figure numbers, and redundant descriptions will be omitted.

The present disclosure relates to a photo mask supporting unit in which a plurality of guide pins, which support corners of a photo mask in four directions using a double slide structure when the photo mask is cleaned to remove a foreign material remaining on the photo mask, are provided on a stage.

In addition, the present disclosure relates to a photo mask cleaning apparatus configured to perform a cleaning process on a photo mask in a state in which a photo mask supporting unit including a plurality of guide pins supports the photo mask.

Hereinafter, the present disclosure will be described in detail with reference to the drawings and the like.

FIG. 1 is a schematic front view illustrating a photo mask cleaning system according to one embodiment of the present disclosure. FIG. 2 is a plan view illustrating components provided in a lower portion of the photo mask cleaning system. FIG. 3 is a plan view illustrating components provided in an upper portion of the photo mask cleaning system. The following descriptions will be made with reference to FIGS. 1 to 3.

A photo mask cleaning system 100 includes an index module 110, which include a load port 111 and a transfer frame 112, and a processing module 120.

In the photo mask cleaning system 100, the load port 111, the transfer frame 112, and the processing module 120 are sequentially disposed in a row. In the following description, a direction in which the load port 111, the transfer frame 112, and the processing module 120 are disposed is defined as an X direction. In addition, a direction perpendicular to the X direction when viewed from above is defined as a Y direction, and a direction perpendicular to a plane including the X direction and the Y direction is defined as a Z direction.

The load port 111 is a port on which a carrier 113 accommodating a photo mask is seated. A plurality of load ports 111 identical to the load port 111 may be provided in the photo mask cleaning system 100.

The plurality of load ports 111 may be disposed in a row in the Y direction. The number of the load ports 111 may be increased or decreased according to process efficiency, a footprint condition, and the like of the processing module 120.

Slots (not shown) may be formed in the carrier 113 to support edges of the photo mask. The plurality of slots may be provided in the Z direction, and here, photo masks are stacked and positioned in the carrier 113 to be spaced apart from each other in the Z direction.

The processing module 120 includes an upper processing module 121 and a lower processing module 122. Each of the upper processing module 121 and the lower processing module 122 includes a transfer housing 210, a buffer unit 220, and process housings 230.

The transfer housing 210 is disposed such that a longitudinal direction thereof is parallel to the X direction. The process housings 230 are disposed at both sides of the transfer housing 210 in the Y direction. The process housings 230 are symmetrically disposed at both sides of the transfer housing 210 with respect to the transfer housing 210.

The plurality of process housings 230 are provided at one side of the transfer housing 210. Some of the plurality of process housings 230 may be disposed in the longitudinal direction of the transfer housing 210. In addition, some of the plurality of process housings 230 may be disposed to overlap. That is, the process housings 230 may be disposed in an array of A×B at one side of the transfer housing 210.

In the above description, A refers to the number of the process housings 230 provided in a row in the X direction, and B refers to the number of the process housings 230 provided in a row in the Y direction. As an example, in a case in which four process housings 230 are provided at one side of the transfer housing 210, the process housings 230 may be disposed in an array of 2×2, and in a case in which six process housings 230 are disposed at one side of the transfer housing 210, the process housings 230 may be disposed in an array of 3×2. The number of the process housings 230 may be increased or decreased.

Meanwhile, in the present disclosure, the process housings 230 may also be provided at only one side of the transfer housing 210. In addition, the process housings 230 may also be provided at one side or both sides of the transfer housing 210 in a single layer.

The buffer unit 220 is disposed between the transfer frame 112 and the transfer housing 210 and provides a space between the process housing 230 and the carrier 113, wherein the photo mask is accommodated in the space before the photo mask is transferred. The buffer unit 220 includes an upper buffer 221 and a lower buffer 222.

The upper buffer 221 is positioned above the lower buffer 222. The upper buffer 221 is disposed at a height corresponding to the upper processing module 121. The lower buffer 222 is disposed at a height corresponding to the lower processing module 122.

A slot in which the photo mask is seated is provided in each of the upper buffer 221 and the lower buffer 222, and the slot is provided as a plurality of slots that are spaced apart from each other in the Z direction. In the buffer unit 220, a surface opposite the transfer frame 112 (surface facing the transfer frame 112) and a surface opposite the transfer housing 210 (surface facing the transfer housing 210) are open.

The transfer frame 112 transfers the photo mask between the carrier 113 on which the load port 111 is seated and the buffer unit 220. An index rail 310 and an index robot 320 are provided to the transfer frame 112.

The index rail 310 is provided such that a longitudinal direction thereof is parallel to the Y direction.

The index robot 320 is installed on the index rail 310 and moves linearly along the index rail 310 in the Y direction. The index robot 320 includes a first base 321, a second body 322, and an index arm 323.

The first base 321 is installed to be moveable along the index rail 310.

The second body 322 is coupled to the first base 321. The second body 322 is provided to be moveable on the first base 321 in the Z direction. In addition, the second body 322 is provided to be rotatable on the first base 321.

The index arm 323 is coupled to the second body 322 and provided to be moveable forward from and backward to the second body 322. The index arm 323 may be provided as a plurality of index arms that are individually driven.

The plurality of index arms 323 are stacked to be spaced apart from each other in the Z direction. Some of the plurality of index arms 323 may be used when the photo mask is transferred from the processing module 120 to the carrier 113. The remaining others may be used when the photo mask is transferred from the carrier 113 to the processing module 120. The plurality of index arms 323 may prevent particles generated by the photo mask, on which a process treatment is not performed yet, from being attached to the photo mask, on which the process treatment is performed, during a process in which the index robot 320 loads or unloads the photo mask.

The transfer housing 210 transfers the photo mask between the buffer unit 220 and the process housing 230 and transfers the photo mask between the process housings 230. A guide rail 240 and a main robot 250 are provided to the transfer housing 210.

The guide rail 240 is disposed such that a longitudinal direction thereof is parallel to the X direction.

The main robot 250 is installed on the guide rail 240 and moves linearly on the guide rail 240 in the X direction. The main robot 250 includes a second base 251, a second body 252, and a main arm 253.

The second base 251 is installed to be moveable along the guide rail 240.

The second body 252 is coupled to the second base 251. The second body 252 is provided to be moveable on the second base 251 in the Z direction. In addition, the second body 252 is provided to be rotatable on the second base 251.

The main arm 253 is coupled to the second body 252 and provided to be moveable forward from and backward to the second body 252. The main arm 253 is provided as a plurality of main arms that are individually driven. The plurality of main arms 253 are stacked to be spaced apart from each other in the Z direction.

A photo mask cleaning apparatus configured to perform a cleaning process on the photo mask is provided in the process housing 230. As an example, the upper processing module 121 may include a chamber configured to perform a dry and functional water cleaning process and a chamber configured to perform a heating process. In addition, the lower processing module 122 may include a chamber configured to perform a wet cleaning process and a chamber configured to perform a cooling process.

The photo mask cleaning apparatuses may have different structures according to kinds of cleaning processes. However, the present embodiment is not limited thereto. The photo mask cleaning apparatuses provided in the process housings 230 may also have the same structure.

The photo mask cleaning apparatus may be formed as a chamber configured to perform a wet cleaning process. As an example, the photo mask cleaning apparatus may be formed as a system configured to remove glue using a chemical.

FIG. 4 is a plan view illustrating a photo mask cleaning apparatus provided in a process housing. In addition, FIG. 5 is a side view illustrating the photo mask cleaning apparatus provided in the process housing. The following descriptions will be made with reference to FIGS. 4 and 5.

A photo mask cleaning apparatus 400 serves to remove glue from a glue area GA positioned at an edge of a pattern area PA of a photo mask 500. The photo mask cleaning apparatus 400 includes a housing 410, a container 420, a photo mask supporting unit 430, a glue cleaning unit 440, a pattern cleaning unit 450, and a controller 460.

The housing 410 provides a sealed inner space. A fan filter unit (not shown) is installed on an upper wall of the housing 410. The fan filter unit generates a vertical air current in the inner space of the housing 410.

The container 420 is disposed in the housing 410. The container 420 prevents the chemical used in a process and fumes generated in the process from being spattered or leaked to the outside. The container 420 has a space of which an upper portion is open and in which the photo mask 500 is processed.

The photo mask supporting unit 430 is disposed in the container 420 and supports the photo mask 500 while a process is performed. The photo mask supporting unit 430 includes a supporting plate 431, a guide pin 432, a supporting shaft 433, and a supporting plate driver 434.

The supporting plate 431 is provided to have a circular shape. The supporting plate 431 has a diameter greater than the photo mask 500.

The supporting plate 431 supports the photo mask 500. While the chemical is supplied, the photo mask 500 is supported to face upward by the supporting plate 431. A plurality of guide pins 432 are provided on an upper surface of the supporting plate 431.

The guide pins 432 protrude upward from the upper surface of the supporting plate 431. When the supporting plate 431 rotates, the guide pins 432 prevent the photo mask 500 from departing from the supporting plate 431 in a side direction.

When the photo mask 500 is placed at a home position on the supporting plate 431, one guide pin 432 is provided at each corner of the photo mask 500. Accordingly, a total of four guide pins 432 are provided. When a process is performed, four guide pins 432 support four corners of the photo mask 500 to prevent the photo mask 500 from departing from the home position.

The supporting shaft 433 is connected to a lower center of the supporting plate 431. The supporting shaft 433 supports the supporting plate 431. The supporting shaft 433 is provided to correspond to a central axis of the supporting plate 431.

The supporting plate driver 434 is connected to a lower end portion of the supporting shaft 433. The supporting plate driver 434 rotates the supporting plate 431. The supporting shaft 433 transmits a rotating force of the supporting plate driver 434 to the supporting plate 431.

The supporting plate driver 434 is controlled by the controller 460. The supporting plate driver 434 may include a motor.

A lifting unit (not shown) vertically moves the container 420 to adjust a height of the supporting plate 431 with respect to the container 420. When the photo mask 500 is loaded on the supporting plate 431 or unloaded from the supporting plate 431, the lifting unit lowers the container 420 such that the supporting plate 431 protrudes upward from the container 420.

The glue cleaning unit 440 is disposed at one side of the container 420. The glue cleaning unit 440 supplies the chemical to an upper surface of the photo mask 500 to remove glue from the photo mask 500.

The glue cleaning unit 440 includes a nozzle assembly 441, a nozzle arm 442, an arm supporting shaft 443, a nozzle driver 444, a chemical supply 445, and a purge gas supply 446.

The nozzle assembly 441 includes a chemical nozzle (not shown) and a purge gas nozzle (not shown). The chemical nozzle is a nozzle configured to spray the chemical for removing glue on a glue area. As an example, the chemical nozzle may spray a sulfuric peroxide mixture (SPM). The purge gas nozzle is a nozzle configured to spray a purge gas on a pattern area in a state in which the purge gas nozzle is closer to the pattern area than the chemical nozzle so that the chemical is not sprayed on the pattern area. As an example, the purge gas nozzle may spray air, inert gas ($N_2$), and the like.

The nozzle arm 442 is provided to have a rod form and supports the nozzle assembly 441. The nozzle arm 442 is disposed such that a longitudinal direction thereof is parallel to the supporting plate 431. The nozzle assembly 441 is coupled to one end portion of the nozzle arm 442, and the other end portion of the nozzle arm 442 is coupled to the arm supporting shaft 443.

The arm supporting shaft 443 supports the nozzle arm 442. The nozzle arm 442 is provided such that a longitudinal direction thereof is a vertical direction. The nozzle arm 442 may be rotated about the arm supporting shaft 443 by the nozzle driver 444. The nozzle driver 444 is provided to a lower end portion of the arm supporting shaft 443.

The nozzle driver 444 moves the nozzle assembly 441 between a stand-by position and a processing position. The stand-by position is a side position of the housing 410. The processing position is a vertically upper position of the supporting plate 431.

The nozzle driver 444 further includes a rotating driver (not shown). The rotating driver rotates the chemical nozzle of the nozzle assembly 441 about the arm supporting shaft 443. As an example, an assembly including a motor, a belt, a pulley, and the like may be provided as the nozzle driver 444.

The chemical supply 445 includes a chemical source and a chemical supply line. The chemical supply line connects the chemical source and the chemical nozzle of the nozzle assembly 441. The chemical stored in the chemical source is supplied to the chemical nozzle of the nozzle assembly 441 through the chemical supply line. A valve configured to open or close the chemical supply line is installed in the chemical supply line.

The purge gas supply 446 includes a purge gas source and a purge gas supply line. The purge gas supply line connects the purge gas source and the purge gas nozzle. Purge gas stored in the purge gas source is supplied to the purge gas nozzle through the purge gas supply line. A valve configured to open or close the purge gas supply line is installed in the purge gas supply line.

The pattern cleaning unit 450 is provided on another side of the container 420. The pattern cleaning unit 450 supplies a cleaning liquid to an upper center of the photo mask 500 to clean a pattern.

The cleaning liquid may include a mixture of ammonium hydroxide, hydrogen peroxide, and ultrapure water, a mixture of ammonia and deionized water, ultrapure water with added carbon dioxide, and the like. The cleaning liquid may be sprayed in a liquid phase or in a form of a mist due to a gas pressure.

The controller 460 controls the nozzle driver 444 and the supporting plate driver 434. The controller 460 controls a rotating time and a rotating angle of each of the nozzle assembly 441 and the photo mask 500 to place the nozzle assembly 441 in a desired area of the photo mask 500 when a process is performed.

The photo mask supporting unit 430 includes the plurality of guide pins 432 which protrude from the upper surface of the supporting plate 431 and support the photo mask 500. Hereinafter, the guide pins 432 will be described.

FIG. 6 is a perspective view illustrating the photo mask supporting unit provided in the photo mask cleaning apparatus according to one embodiment. In FIG. 6, the photo mask 500 is seated on the photo mask supporting unit 430 using the guide pins 432. The following descriptions will be made with reference to FIG. 6.

The photo mask supporting unit 430 may support and rotate the photo mask 500 when a process is performed. A driver such as a motor configured to provide a rotating force may be fixedly coupled to a lower end portion of the photo mask supporting unit 430.

The photo mask supporting unit 430 includes the supporting plate 431 provided to have a circular shape when viewed from above. The plurality of guide pins 432 configured to support the corners of the photo mask 500 are provided on the upper surface of the supporting plate 431.

The guide pins 432 are pins configured to guide the photo mask 500 so as to not depart to the outside when the photo mask 500 is rotated by the photo mask supporting unit 430.

Conventionally, supporting pins are additionally provided at front portions of the guide pins 432, and the photo mask 500 is seated on the supporting pins and supported thereby. However, in this case, when the photo mask 500 is rotated by the photo mask supporting unit 430, since the supporting pins and the photo mask 500 are in surface-to-surface contact with each other, a plurality of scratches may occur on one surface of the photo mask 500 due to the supporting pins.

In the present disclosure, the supporting pins are not provided at the front portions of the guide pins 432, and double slide structures are formed on side surfaces of the guide pins 432.

FIG. 7 is a perspective view illustrating the guide pin provided in the photo mask supporting unit according to one embodiment, and FIG. 8 is a partially enlarged view illustrating a part C of the guide pin illustrated in FIG. 7. The following descriptions will be made with reference to FIGS. 7 and 8.

The guide pin 432 includes two columns 510 and 520 formed to protrude upward from one surface thereof. A first column 510 and a second column 520 may be formed to have polygonal columns (for example, quadrilateral columns).

The double slide structure including a first sliding portion 530 and a second sliding portion 540 may be formed on a side surface of each of the first column 510 and the second column 520.

The first sliding portion 530 and the second sliding portion 540 may be formed on each of the first column 510 and the second column 520. However, the present disclosure is not limited thereto. The first sliding portion 530 and the second sliding portion 540 may also be formed on any one of the first column 510 and the second column 520.

The first sliding portion 530 and the second sliding portion 540 are formed to be connected to each other on the side surface of each of the first column 510 and the second column 520, and the first sliding portion 530 is formed on the second sliding portion 540. Here, the first sliding portion 530 may be formed to be longer than the second sliding portion 540.

Meanwhile, the first sliding portion 530 and the second sliding portion 540 may be formed to be spaced apart from each other on the side surface of each of the first column 510 and the second column 520.

The first sliding portion 530 may be formed to be inclined downward from the side surface of each of the first column 510 and the second column 520. Here, the first sliding portion 530 may be formed to be inclined downward to have a first inclination angle m with respect to the side surface of each of the first column 510 and the second column 520.

The second sliding portion 540 is formed to be inclined downward from a contact line 550 between the second sliding portion 540 and the first sliding portion 530. Here, the second sliding portion 540 may be formed to be inclined downward to have a second inclination angle n with respect to the side surface of each of the first column 510 and the second column 520.

In the above description, the first inclination angle m and the second inclination angle n are acute angles, and the second inclination angle n may be formed to be greater than the first inclination angle m. The second inclination angle n may be formed to have a value corresponding to 1.5 times the first inclination angle m. As an example, the first inclination angle m may be 45°, and the second inclination angle n may be 67.5°.

The side surfaces of the first column 510 and the second column 520 in which the first sliding portions 530 and the second sliding portions 540 are formed may form third angles to fix the corner of the photo mask 500. That is, the side surface of the first column 510 in which the first sliding portion 530 and the second sliding portion 540 are formed is not parallel to the side surface of the second column 520 in which the first sliding portion 530 and the second sliding portion 540 are formed and may be formed to be inclined by the third angle with respect thereto. Here, the third angle may be a right angle. However, the present disclosure is not limited thereto. The third angle may also be an acute or obtuse angle.

As described above, in a case in which the double slide structure is formed at the side surface of each of the first column 510 and the second column 520 which include the first sliding portions 530 and the second sliding portions 540, since a corner of a bottom surface of the photo mask 500 is in line contact with a slope (for example, the contact line 550 between the first sliding portion 530 and the second sliding portion 540) of the double slide structure, the photo mask 500 may be seated thereon. In this case, even when the photo mask 500 is rotated by the photo mask supporting unit 430, the guide pins 432 may stably support the photo mask 500.

In addition, when the photo mask 500 is rotated by the photo mask supporting unit 430, since the guide pins 432 and the photo mask 500 are in surface-to-line contact with each other, the guide pins 432 may also eliminate a scratch generation factor which may be generated on one surface of the photo mask 500.

As described above, when the first sliding portions 530 and the second sliding portions 540 which have different angles are formed on the side surfaces of the first columns 510 and the second columns 520, the double slide structures may serve to support corner surfaces of the photo mask 500 and simultaneously serve to guide the photo mask 500 such that eccentricity of the photo mask 500 does not occur on the photo mask supporting unit 430.

Meanwhile, the plurality of guide pins 432 may also be formed to support flat side surfaces of the photo mask 500 instead of supporting the corners of the photo mask 500.

FIG. 9 is a perspective view illustrating a photo mask supporting unit provided in a photo mask cleaning apparatus according to another embodiment, and FIG. 10 is a perspective view illustrating a guide pin provided in the photo mask supporting unit according to another embodiment. The following descriptions will be made with reference to FIGS. 9 and 10.

Guide pins 432 may be formed to support flat side surfaces of a photo mask 500 in four directions. In this case, the guide pin 432 may include only a first column 510 to support the flat side surface of the photo mask 500.

Although the embodiments of the present disclosure have been described with reference the accompanying drawings, it will be understood by those skilled in the art that the disclosure may be performed in other concrete forms without changing the technological scope and essential features. Therefore, the above-described embodiments should be considered as only examples in all aspects and not for purposes of limitation.

What is claimed is:

1. A photo mask supporting unit comprising:
a supporting plate;
a supporting shaft which supports the supporting plate from under the supporting plate;
a supporting plate driver configured to rotate the supporting plate; and
a guide pin provided as a plurality of guide pins on the supporting plate to support a photo mask and including at least one column protruding upward from a flat surface and having a first sliding portion and a second sliding portion formed on a side surface of the column to be inclined downward to have different angles, and wherein the first sliding portion has a first positive angle relative to an axis of the guide pin, and the second sliding portion has a second positive inclination angle different from the first positive inclination angle relative to the axis of the guide pin.

2. The photo mask supporting unit of claim 1, wherein:
the first sliding portion is formed to be inclined downward to have a first inclination angle with respect to the side surface of the column;
the second sliding portion is formed to be inclined downward to have a second inclination angle with respect to the side surface of the column; and
the second inclination angle is greater than the first inclination angle.

3. The photo mask supporting unit of claim 1, wherein:
the first sliding portion and the second sliding portion are continuously formed on the side surface of the column; and
the first sliding portion is positioned at a higher level than the second sliding portion.

4. The photo mask supporting unit of claim 1, wherein:
the column is provided as one column formed to protrude from the flat surface of the guide pin; or
the column is provided as two columns formed to protrude from the flat surface of the guide pin.

5. The photo mask supporting unit of claim 4, wherein, in a case in which the column is provided as the two columns formed to protrude from the flat surface of the guide pin, a side surface of a first column in which the first sliding portion and the second sliding portion are formed is not parallel to a side surface of a second column in which the first sliding portion and the second sliding portion are formed.

6. The photo mask supporting unit of claim 5, wherein the first column and the second column support corners of the photo mask.

7. The photo mask supporting unit of claim 4, wherein, in a case in which the column is provided as the one column is formed to protrude from the flat surface of the guide pin, the column supports a flat side surface of the photo mask.

8. The photo mask supporting unit of claim 1, wherein a length of the first sliding portion is longer than a length of the second sliding portion.

* * * * *